United States Patent

[11] 3,577,012

[72] Inventor Ernst H. Dummermuth
E. Cleveland, Ohio

[21] Appl. No. 764,732
[22] Filed Oct. 3, 1968
[45] Patented May 4, 1971
[73] Assignee Allen-Bradley Company
Milwaukee, Wis.

[54] CIRCUIT FOR CONTROLLING FREQUENCY WITH VOLTAGE
6 Claims, 1 Drawing Fig.

[52] U.S. Cl. .......... 307/271, 307/225, 307/228, 307/235, 307/215, 328/147, 328/150, 328/181
[51] Int. Cl. .......... H03k 1/14
[50] Field of Search .......... 307/243, 239, 271, 225, 228; 328/146, 147, 150, 181

[56] References Cited
UNITED STATES PATENTS

| | | | |
|---|---|---|---|
| 3,214,610 | 10/1965 | Baude .......... | 328/147X |
| 3,479,496 | 11/1969 | Buesch et al. .......... | 328/146X |
| 3,484,723 | 12/1969 | Rypkema .......... | 307/243X |
| 3,191,071 | 6/1965 | King et al. .......... | 307/271X |
| 3,364,437 | 1/1968 | Loposer et al. .......... | 328/181X |

*Primary Examiner*—John S. Heyman
*Attorneys*—Arnold J. Ericsen and Richard C. Steinmetz, Jr.

ABSTRACT: A circuit for providing output pulses at a frequency determined by a variable DC control voltage. The circuit includes a gate to which an oscillator output is applied. The gate is controlled by the output of a comparator circuit which compares the amplitude of a ramp signal with the DC control voltage. The ramp signal is generated at a frequency which is a subharmonic of the oscillator frequency. The gate passes the oscillator output pulses as long as the ramp signal amplitude is less than the DC control voltage.

PATENTED MAY 4 1971 3,577,012
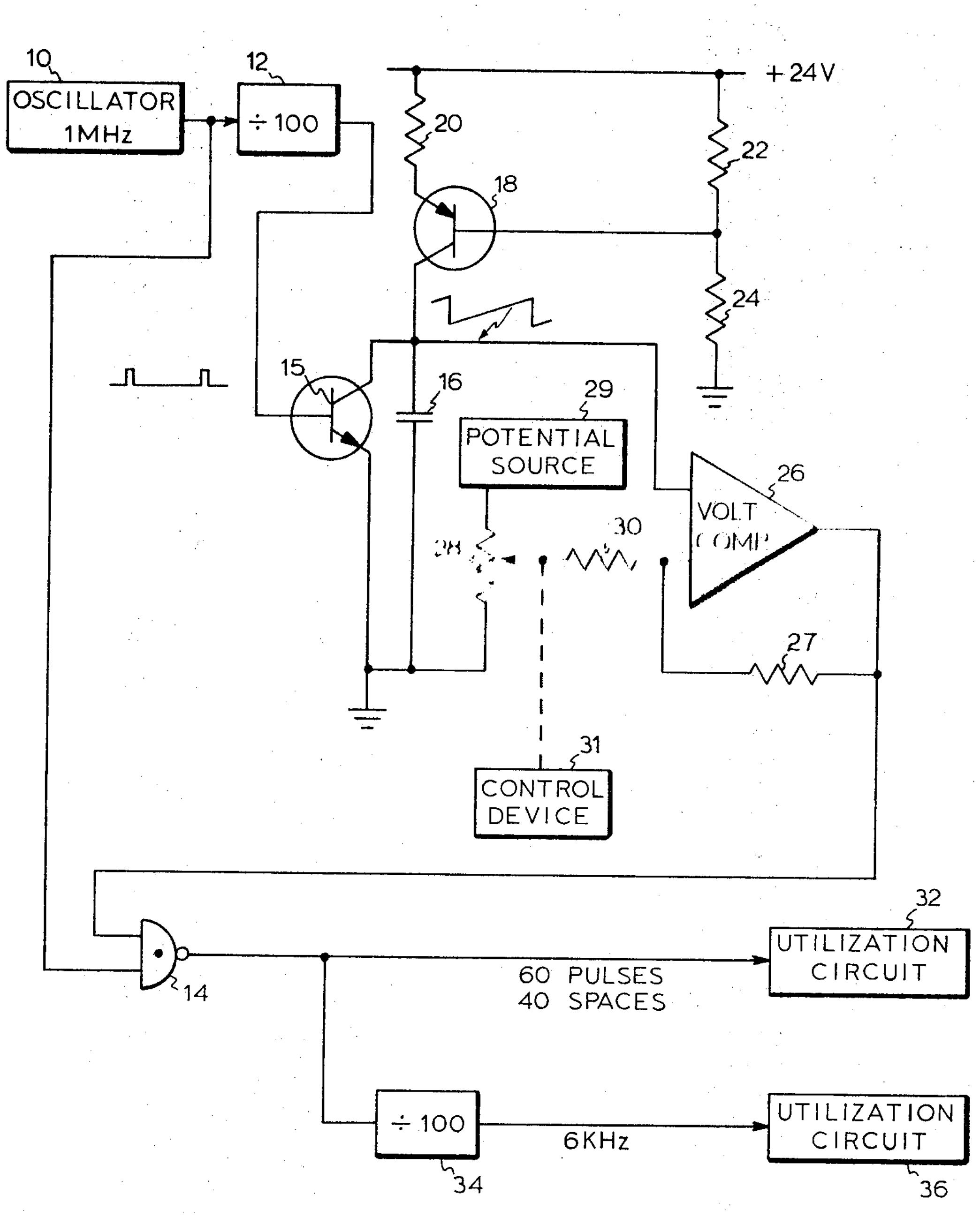
INVENTOR.
ERNST H. DUMMERMUTH
BY Lindenberg + Freilich
ATTORNEYS

CIRCUIT FOR CONTROLLING FREQUENCY WITH VOLTAGE

BACKGROUND OF THE INVENTION

Field of the Invention

This invention relates to frequency control circuits which permit a desired number of pulses to be obtained, within a predetermined interval, from an oscillator.

OBJECTS AND SUMMARY OF THE INVENTION

This invention seeks to provide a novel useful and simplified circuit arrangement for obtaining a desired number of pulses within a predetermined interval from an oscillator.

The foregoing is achieved in a preferred circuit arrangement wherein the output of a clock oscillator is applied to a gate and to a frequency divider. The frequency divider output is used to discharge a capacitor which is repeatedly charged up from a constant voltage source and then discharged, to thus provide a sawtooth waveform. The sawtooth waveform, together with a controllable DC control voltage, is applied to a voltage comparator. The voltage comparator output enables a gate, to which the clock oscillator output is applied, during those intervals in which the voltage amplitude of the sawtooth waveform is less than the DC control voltage. Accordingly, over the interval established by the frequency divider, the number of pulses desired can be derived by the setting of the DC control voltage.

The novel features of the invention are set forth with particularity in the appended claims. The invention will best be understood when read in conjunction with accompanying drawing.

BRIEF DESCRIPTION OF THE DRAWING

The drawing shows a circuit diagram of a preferred embodiment of the invention.

DESCRIPTION OF THE PREFERRED EMBODIMENT

Referring now to the drawing, an oscillator 10, which may be a crystal oscillator, has its output applied to a frequency divider 12 and also to a NAND gate 14. By way of illustration, and not to serve as a limitation on the invention, it will be assumed that the crystal oscillator 10 provides an output frequency on the order of 1 MHz. and the frequency divider 12 is a "divide by 100" frequency divider. Accordingly, the output of the frequency divider will be 10 kHz. The divider output is applied to the base of an NPN transistor 15 to enable it to become conductive each time it receives a positive output pulse. This occurs, with the numbers used by way of example, every 100 microseconds. The collector and emitter terminals of the transistor 15 are respectively connected to different terminals of a capacitor 16. The transistor 15 emitting terminal and the capacitor terminal connected thereto are connected in common to a reference potential, illustrated as ground. The transistor 15 collector terminal and the capacitor terminal connected thereto are connected in common to the collector terminal of PNP transistor 18.

The emitter terminal of transistor 18 is connected through a resistor 20 to a source of positive potential (illustrated as +24 volts). The base terminal of transistor 18 is connected through a resistor 22 to the source of positive potential as well as through a resistor 24 to ground.

Those skilled in the art will readily recognize that the transistor 18 is connected in a manner to supply charging current to the capacitor 16 while the emitter-collector path of transistor 15 is connected so as to discharge the capacitor when conductive. As will be appreciated, the values of resistor 20 and capacitor 16 can be selected to charge the capacitor substantially linearly to thus generate a sawtooth waveform at the upper (as illustrated) capacitor terminal. On the basis of the values previously assumed, the sawtooth waveform will have a frequency on the order of 10 kHz. or a period equal to 100 microseconds.

The sawtooth voltage provided at the upper capacitor terminal is applied as one input to a voltage comparator 26. The other input to the voltage comparator is a variable DC control voltage derived from the slider arm of a potentiometer 28 which has one end connected to ground and the other end connected to a positive potential source 29. The potentiometer slider arm is connected through a resistor 30 to the input of the voltage comparator 26.

The potentiometer 28 exemplifies a simplified arrangement for providing a DC control voltage to the voltage comparator 26. Obviously other circuits may be used for this purpose without departing from the spirit and scope of this invention. For example, in closed-loop velocity control servosystems the DC control voltage may be derived from a feedback such as a tachometer. For example, the feedback signal provided by the tachometer can be applied to a control device 31 to in turn mechanically control the slider arm of the potentiometer 28 to thus vary the output frequency of gate 14 so as, for example, to maintain velocity constant.

A positive feedback resistor 27 couples the output of the voltage comparator 26 to the comparator input terminal to which the resistor 30 is connected. The resistor 27 provides hysteresis, tending to hold the comparator in whatever state its in, by, for example, lowering the effective potential on the comparator input terminal to which resistor 30 is connected when the comparator output voltage is low. The output of voltage comparator 26 is also applied as an input to the NAND gate 14. The voltage comparator output enables the NAND gate 14 to pass pulses received from the oscillator so long as the amplitude of the sawtooth voltage being generated across capacitor 16 does not exceed the amplitude of the DC control voltage. Accordingly, the output of the NAND gate 14 will consist of a number of pulses within the portion of the 100-microsecond period whose duration is determined by the amplitude of the DC control voltage.

By way of example, assume that the potential source 29 supplies a DC voltage of +5 volts and the DC control voltage applied to the voltage comparator is on the order of +3 volts. Also assume that the sawtooth waveform goes from ground to +5 volts. Accordingly, gate 14 will pass output pulses applied thereto from the oscillator 10 for three-fifths of 60 percent of a full sawtooth waveform period. Thus during a 100-microsecond period, pulses will be passed for only 60 microseconds (i.e., 60 pulses). The output of the NAND gate 14 may be used directly by a utilization circuit 32 or may be applied to an accumulator 34. The output of the accumulator 34, which is by way of example, a divide by 100 counter will consist of 60 percent of 10 kHz. or 6 kHz. This too may be applied to a utilization circuit 34. The direct output of the NAND gate 14 will be 600 kHz. average frequency. Thus, be varying the DC control voltage applied to the voltage comparator 26, an output signal having a frequency which is a particular fraction of the oscillator frequency can be obtained.

There has accordingly been described and shown herein a novel and useful circuit arrangement for deriving a desired frequency from a clock frequency by the simple expedient of controlling the voltage applied to a voltage comparator.

Although particular embodiments of the invention have been described and illustrated herein, it is recognized that modifications and variations may readily occur to those skilled in the art and consequently it is intended that the claims be interpreted to cover such modifications and equivalents.

I claim:

q. A frequency control circuit comprising:

an oscillator producing output pulses at a predetermined frequency;

a gate, said gate having an enabling input terminal and an input terminal to which the output of said oscillator is applied;

frequency divider means responsive to said oscillator output for producing a pulse signal train at a lower frequency than said oscillator predetermined frequency;

a ramp voltage generator means for generating a rising ramp voltage in synchronism with the pulses of said pulse signal train;

means for generating a control voltage having a selected amplitude;

comparator means for comparing the amplitude of said rising ramp voltage and said control voltage for providing a predetermined output voltage responsive thereto; and means for applying said predetermined duration output voltage to said gate enabling input terminal to enable said gate to pass pulses from said oscillator during said predetermined duration of said predetermined output voltage.

2. A frequency control circuit for use with an oscillator producing output pulses at a predetermined frequency, said circuit comprising:

a gate, said gate having an enabling input terminal and an input terminal adapted to receive said oscillator output pulses;

means responsive to said oscillator output for repetitively generating a voltage having a changing amplitude waveform, the repetitive frequency of said waveform being lower than the frequency of said oscillator output pulses;

means for selecting a predetermined amplitude level on each changing amplitude waveform; and means for enabling said gate to pass said oscillator output pulses over an interval determined by the time required for the amplitude of said changing amplitude waveform to reach the amplitude level selected.

3. A circuit as recited in claim 2 wherein said means for enabling said gate comprises a voltage comparator having a first and a second input;

means for applying said changing amplitude waveform to said first input;

means for applying a DC control voltage having a desired level to said second input; and means for applying the output of said voltage comparator to said gate for enabling said gate until the amplitude of said changing amplitude waveform exceeds the amplitude of said DC control voltage.

4. A circuit as recited in claim 2 wherein said means for repetitively generating a voltage having a changing amplitude waveform includes frequency divider means responsive to said oscillator output pulses;

a capacitor;

means for charging said capacitor; and means for discharging said capacitor responsive to the output from said frequency divider.

5. A frequency control circuit comprising:

an oscillator providing output pulses at a predetermined frequency;

frequency-dividing means to which the output of said oscillator is applied;

means for generating a sawtooth voltage waveform at a frequency determined by the output of said frequency-dividing means;

a voltage comparator having first and second input terminals and an output terminal;

means for generating a control voltage having a desired amplitude;

means for applying said sawtooth voltage and said control voltage to said respective comparator first and second input terminals;

a gate having first and second input terminals;

means for applying said oscillator output to said gate first input terminal; and means for coupling said voltage comparator output terminal to said gate second input terminal to enable said gate to pass pulses from said oscillator so long as the amplitude of said sawtooth voltage waveform is less than said control voltage amplitude.

6. A frequency control circuit as recited in claim 5 wherein said means for generating a sawtooth voltage waveform includes a capacitor having first and second terminals;

means for charging said capacitor including a first transistor having base, emitter and collector electrodes;

means connecting said collector electrode to a first terminal of said capacitor;

means for applying an operating potential between said emitter electrode and said second terminal of said capacitor;

means for selectively biasing said first transistor base electrode to render it conductive;

means for discharging said capacitor including a second transistor having base, emitter and collector electrodes;

means for connecting said second transistor collector and emitter electrodes respectively to said first and second electrodes of said capacitor; and means for applying the output of said frequency dividing means to said second transistor base electrode.

PO-1050
(5/69)

UNITED STATES PATENT OFFICE
CERTIFICATE OF CORRECTION

Patent No. 3,577,012 Dated May 4, 1971

Inventor(s) Ernst H. Dummermuth

It is certified that error appears in the above-identified patent and that said Letters Patent are hereby corrected as shown below:

Column 2, Line 15 after "feedback" -- device -- should appe

Column 2, Line 52 "be" should read -- by -- (second occurre

Column 2, Line 66 "q" should read -- 1 --

Signed and sealed this 28th day of September 1971.

(SEAL)
Attest:

EDWARD M.FLETCHER,JR.
Attesting Officer

ROBERT GOTTSCHALK
Acting Commissioner of Pate